United States Patent
West et al.

(10) Patent No.: US 7,760,980 B2
(45) Date of Patent: Jul. 20, 2010

(54) RIDGE TECHNIQUE FOR FABRICATING AN OPTICAL DETECTOR AND AN OPTICAL WAVEGUIDE

(75) Inventors: Lawrence C. West, San Jose, CA (US); Gregory L. Wojcik, Ben Lomond, CA (US); Francisco A. Leon, Palo Alto, CA (US); Yonah Cho, Sunnyvale, CA (US); Andreas Goebel, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 493 days.

(21) Appl. No.: 11/514,291

(22) Filed: Aug. 31, 2006

(65) Prior Publication Data
US 2007/0053643 A1    Mar. 8, 2007

Related U.S. Application Data

(60) Provisional application No. 60/713,497, filed on Sep. 1, 2005.

(51) Int. Cl.
G02B 6/10     (2006.01)
G02B 6/13     (2006.01)

(52) U.S. Cl. ......................................... 385/129; 385/14
(58) Field of Classification Search ........................ None
See application file for complete search history.

(56) References Cited

U.S. PATENT DOCUMENTS

| | | | |
|---|---|---|---|
| 3,217,856 A | 11/1965 | Miles | |
| 4,006,432 A | 2/1977 | Streifer et al. | |
| 4,100,562 A | 7/1978 | Sugawara et al. | |
| 4,368,481 A | 1/1983 | Ohashi et al. | |
| 4,438,447 A | 3/1984 | Copeland, III et al. | |
| 4,486,765 A | 12/1984 | Capasso | |

(Continued)

FOREIGN PATENT DOCUMENTS

EP     0661561 A2    7/1995

(Continued)

OTHER PUBLICATIONS

Chen et al., "Fully Embedded Board-Level Guided-Wave Optoelectronic Interconnects," Proceedings of the IEEE, 88(6):780-793 (2000).

(Continued)

*Primary Examiner*—Mike Stahl
(74) *Attorney, Agent, or Firm*—Wilmerhale

(57) ABSTRACT

A method of fabricating on a substrate an optical detector in an optical waveguide, the method involving: forming at least one layer on a surface of the substrate, said at least one layer comprising SiGe; implanting an impurity into the at least one layer over a first area to form a detector region for the optical detector; etching into the at least one layer in a first region and a second region to form a ridge between the first and second regions, said ridge defining the optical detector and the optical waveguide; filling the first and second regions with a dielectric material having a lower refractive index than SiGe; and after filling the first and second regions with the dielectric material, removing surface material to form a planarized upper surface.

21 Claims, 8 Drawing Sheets

U.S. PATENT DOCUMENTS

| | | | |
|---|---|---|---|
| 4,720,468 A | 1/1988 | Menigaux et al. | |
| 4,734,910 A | 3/1988 | Izadpanah | |
| 4,759,023 A | 7/1988 | Yamaguchi et al. | |
| 4,835,575 A | 5/1989 | Plihal | |
| 4,959,540 A | 9/1990 | Fan et al. | |
| 4,966,430 A | 10/1990 | Weidel et al. | |
| 4,980,568 A | 12/1990 | Merrick et al. | |
| 5,098,861 A | 3/1992 | Blackstone | |
| 5,122,852 A | 6/1992 | Chang et al. | |
| 5,190,883 A | 3/1993 | Menigaux et al. | |
| 5,193,131 A | 3/1993 | Bruno et al. | |
| 5,195,161 A | 3/1993 | Adar et al. | |
| 5,280,189 A * | 1/1994 | Schuppert et al. | 257/458 |
| 5,291,010 A | 3/1994 | Tsuji et al. | |
| 5,298,787 A | 3/1994 | Bozler et al. | |
| 5,345,557 A | 9/1994 | Wendt et al. | |
| 5,357,122 A | 10/1994 | Okubora et al. | |
| 5,382,810 A | 1/1995 | Isaksson et al. | |
| 5,463,229 A | 10/1995 | Takase et al. | |
| 5,481,515 A | 1/1996 | Kando et al. | |
| 5,485,021 A | 1/1996 | Abe et al. | |
| 5,523,557 A | 6/1996 | Bruno et al. | |
| 5,536,974 A | 7/1996 | Nishiguchi et al. | |
| 5,548,433 A | 8/1996 | Smith et al. | |
| 5,569,934 A | 10/1996 | Fujii et al. | |
| 5,604,361 A | 2/1997 | Isaksson et al. | |
| 5,633,527 A | 5/1997 | Lear | |
| 5,663,592 A | 9/1997 | Miyazawa et al. | |
| 5,682,455 A * | 10/1997 | Kovacic et al. | 385/131 |
| 5,728,605 A | 3/1998 | Mizutani et al. | |
| 5,767,508 A | 6/1998 | Masui et al. | |
| 5,793,913 A | 8/1998 | Kovacic | |
| 5,801,872 A | 9/1998 | Tsuji et al. | |
| 5,812,708 A | 9/1998 | Rao | |
| 5,818,096 A | 10/1998 | Ishibashi et al. | |
| 5,825,051 A | 10/1998 | Bauer et al. | |
| 5,828,679 A | 10/1998 | Fisher et al. | |
| 5,854,804 A | 12/1998 | Winer et al. | |
| 5,889,903 A | 3/1999 | Rao | |
| 5,942,789 A | 8/1999 | Morikawa et al. | |
| 5,945,720 A | 8/1999 | Itatani et al. | |
| 5,946,438 A | 8/1999 | Minot et al. | |
| 5,970,081 A | 10/1999 | Hirayama et al. | |
| 5,987,196 A | 11/1999 | Noble | |
| 6,011,296 A | 1/2000 | Hassard et al. | |
| 6,031,243 A | 2/2000 | Taylor | |
| 6,043,515 A | 3/2000 | Kamiguchi et al. | |
| 6,066,860 A | 5/2000 | Katayama et al. | |
| 6,075,253 A | 6/2000 | Sugiyama et al. | |
| 6,093,939 A | 7/2000 | Artigue et al. | |
| 6,125,217 A | 9/2000 | Paniccia et al. | |
| 6,202,165 B1 | 3/2001 | Pine | |
| 6,232,142 B1 | 5/2001 | Yasukawa et al. | |
| 6,288,410 B1 | 9/2001 | Miyazawa et al. | |
| 6,310,372 B1 | 10/2001 | Katayama et al. | |
| 6,318,901 B1 | 11/2001 | Heremans et al. | |
| 6,320,204 B1 | 11/2001 | Hirabayashi et al. | |
| 6,343,171 B1 | 1/2002 | Yoshimura et al. | |
| 6,346,717 B1 | 2/2002 | Kawata | |
| 6,392,342 B1 | 5/2002 | Parikka | |
| 6,393,183 B1 | 5/2002 | Worley | |
| 6,403,395 B2 | 6/2002 | Hirabayashi et al. | |
| 6,407,438 B1 | 6/2002 | Severn | |
| 6,426,522 B1 | 7/2002 | Kean et al. | |
| 6,449,411 B1 | 9/2002 | Nakamura et al. | |
| 6,528,779 B1 | 3/2003 | Franz et al. | |
| 6,645,829 B2 | 11/2003 | Fitzergald | |
| 6,658,173 B2 | 12/2003 | Delwala | |
| 6,677,655 B2 | 1/2004 | Fitzergald | |
| 6,680,495 B2 | 1/2004 | Fitzergald | |
| 6,690,078 B1 | 2/2004 | Irissou et al. | |
| 6,753,214 B1 | 6/2004 | Brinkmann et al. | |
| 6,770,134 B2 | 8/2004 | Maydan et al. | |
| 7,110,629 B2 | 9/2006 | Bjorkman et al. | |
| 2002/0079427 A1* | 6/2002 | Xu et al. | 250/214.1 |
| 2002/0146865 A1 | 10/2002 | Hoel | |
| 2002/0174826 A1 | 11/2002 | Maydan et al. | |
| 2002/0174827 A1 | 11/2002 | Samoilov et al. | |
| 2002/0181825 A1 | 12/2002 | Johnson et al. | |
| 2003/0015720 A1 | 1/2003 | Lian et al. | |
| 2003/0025118 A1 | 2/2003 | Yamazaki et al. | |
| 2003/0026523 A1* | 2/2003 | Chua et al. | 385/16 |
| 2003/0052082 A1 | 3/2003 | Khan et al. | |
| 2003/0052088 A1 | 3/2003 | Khan et al. | |
| 2003/0072548 A1 | 4/2003 | Bhardwaj et al. | |
| 2003/0110808 A1 | 6/2003 | M'Saad et al. | |
| 2003/0113085 A1 | 6/2003 | M'Saad | |
| 2003/0114006 A1 | 6/2003 | White | |
| 2003/0176075 A1* | 9/2003 | Khan et al. | 438/714 |
| 2004/0012037 A1 | 1/2004 | Venkatesan et al. | |
| 2004/0012041 A1 | 1/2004 | West et al. | |
| 2004/0012401 A1 | 1/2004 | King et al. | |
| 2004/0013338 A1 | 1/2004 | Bjorkman et al. | |
| 2004/0037512 A1 | 4/2004 | Cho et al. | |
| 2004/0155751 A1 | 8/2004 | Benzel et al. | |
| 2004/0266145 A1* | 12/2004 | Morse | 438/481 |
| 2005/0053347 A1 | 3/2005 | West et al. | |
| 2005/0072979 A1 | 4/2005 | West et al. | |
| 2005/0212068 A1* | 9/2005 | Leon et al. | 257/432 |
| 2005/0214964 A1 | 9/2005 | West et al. | |
| 2006/0039666 A1 | 2/2006 | Knights et al. | |

FOREIGN PATENT DOCUMENTS

| | | |
|---|---|---|
| WO | WO-02/095092 | 11/2002 |
| WO | WO-03036369 | 5/2003 |
| WO | WO-03/060599 A2 | 7/2003 |

OTHER PUBLICATIONS

Choi et al., "Self-Aligning Silicon Groove Technology Platform for the Low Cost Optical Module," 1999 Electronic Components and Technology Conference, IEEE, pp. 1140-1144 (1999).

Irace et al., "Fast Silicon-on-Silicon Optoelectronic Router Based on a BMFET Device," IEEE Journal of Selected Topics in Quantum Electronics, 6(1):14-18 (2000).

Jalali et al., "Advances in Silicon-on-Insulator Optoelectronics," IEEE Journal of Selected Topics in Quantum Electronics, 4(6):938-947 (1998).

Janz, et al., "Optical Properties of Pseudomorphic $Si_{1-x}Ge_x$ for Si-Based Waveguides at the .lamda.=1300-nm and 1550-nm Telecommunications Wavelength Bands". IEEE Journal of Selected topics in Quantum Electronics. vol. 4(6) (1998), pp. 990-996.

Kimerling, "Photons to the Rescue: Microelectronics Becomes Microphotonics," The Electrochemical Society Interface, pp. 28-31 (Summer 2000).

Kostal, "Nano-optics Changes the Rules for Optical Components," NanoOpto White Paper 2002.001, pp. 1-6 (2002).

Kostal, et al., "Nano-optics: New Rules for Optical System Design," NanoOpto White Paper 2002.002, pp. 1-10, (2002).

Motorola Labs, "The Discovery: Motorola Labs solves a 30-year semiconductor industry puzzle," Jun. 2002.

Pearsall et al., "Spectroscopy of band-to-band optical transitions in si-ge alloys and superlattices", Physical Review B., 57(15):9218-9140 (1998).

Schaub et al., "High-Speed Monolithic Silicon Photoreceivers on High Resistivity and SOI Substrates," Journal of Lightwave Technology, 19(2):272-278 (2001).

Schuppert et al., "Optical Channel Waveguides in Silicon Diffused from GeSi Alloy". Electronics Letters. vol. 25 (22)(1999), pp. 1500-1502.

Soref et al., "Large Single-Mode Rib Waveguides in GeSi-Si and Si-on-SiO2" IEEE Journal of Quantum Electronics. vol. 27 (8) (1991), pp. 1971-1974.

Soref et al., "Optical Waveguiding in a Single-crystal Layer of Germanium Silicon Grown on Silicon" Optics Letters. vol. 15(5) (1990), pp. 270-272.

Splett et al., "Low Loss Optical Ridge Waveguides in a Strained GeSi Epitaxial Layer Grown on Silicon". Electronics Letters. vol. 26(14) (1990), pp. 1035-1037.

Tashiro et al., "A Selective Epitaxial SiGe/Si Planar Photodetector for Si-Based OEIC's" IEEE Transactions on Electronic Devices, 44(4):545-550 (1997).

Temkin et al., "Ge0.6 Si0.4 Rib waveguide avalanche photodetectors for 1.3 um operation", Appl. Phys. Lett., 49:809-811 (1986).

Temkin et al., "Gex SI1-x strained-layer superlattice waveguide photodetectors operating near 1.3um", Appl. Phys. Lett., 48(15):963-965 (1986).

Walker et al., "Design and fabrication of high-efficiency beam splitters and beam deflectors for integrated planar micro-optic systems," Applied Optics, 32(14):2494-2501 (1993).

Walker, et al., "Optical clock distribution using integrated free-space optics," Optics Communications 90, pp. 359-371 (1992).

Yabu et al., "New Design Method for Low-Loss Y-Branch Waveguides," Journal of Lightwave Technology, 19(9):1376-1384 (2001).

Yang et al., "A high speed, high sensitivity silicon lateral trench photodetector", IEEE Electron Device Letters, 23(7):395-397 (2002).

Huang et al., Epitaxial SiGeC Waveguide Photodetector Grown on Si Substrate with Response in the 1.3-1.55 micron Wavelength Range, IEEE Photonics Technology Letters, IEEE Service Center, Piscataway, NJ, US, vol. 9, No. 2, 1997, pp. 229-231.

Wohl et al., SiGe pin-photodetetors integrated on silicon substrates for optical fiber links, Solid-State Circuits Conference, 2003, Digest of Technical Papers, Paper 21.4, ISSCC, 2003 IEEE International San Francisco, CA.

International Search Report as issued in related international application No. PCT/US2006/033545 on Jan. 18, 2007.

\* cited by examiner

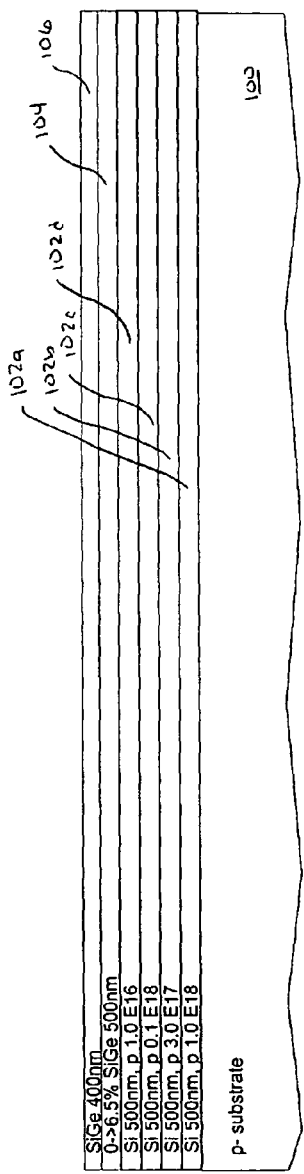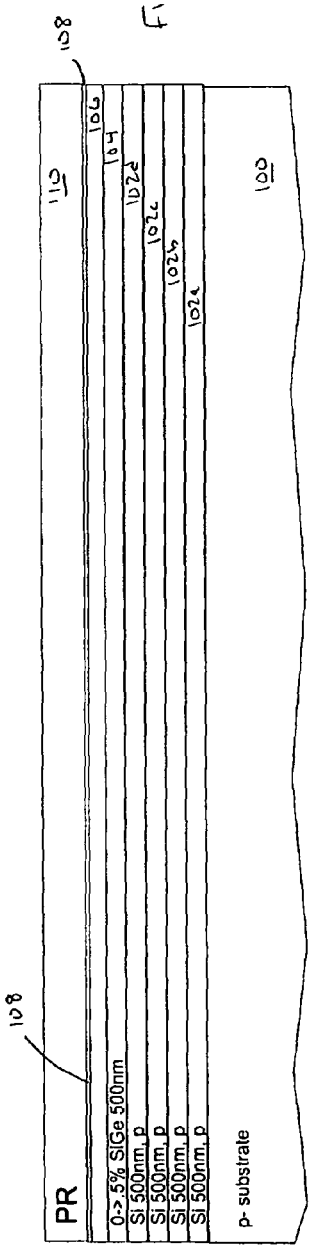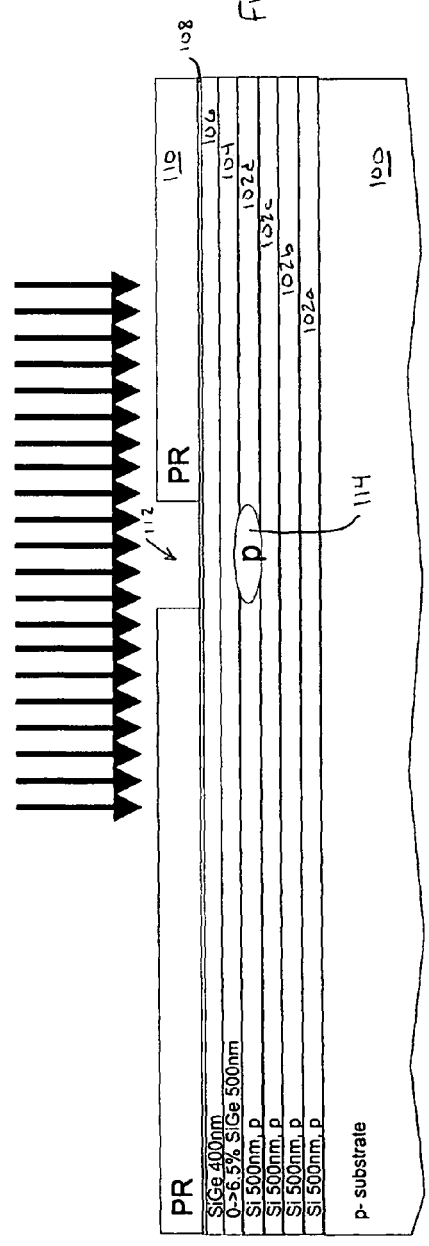

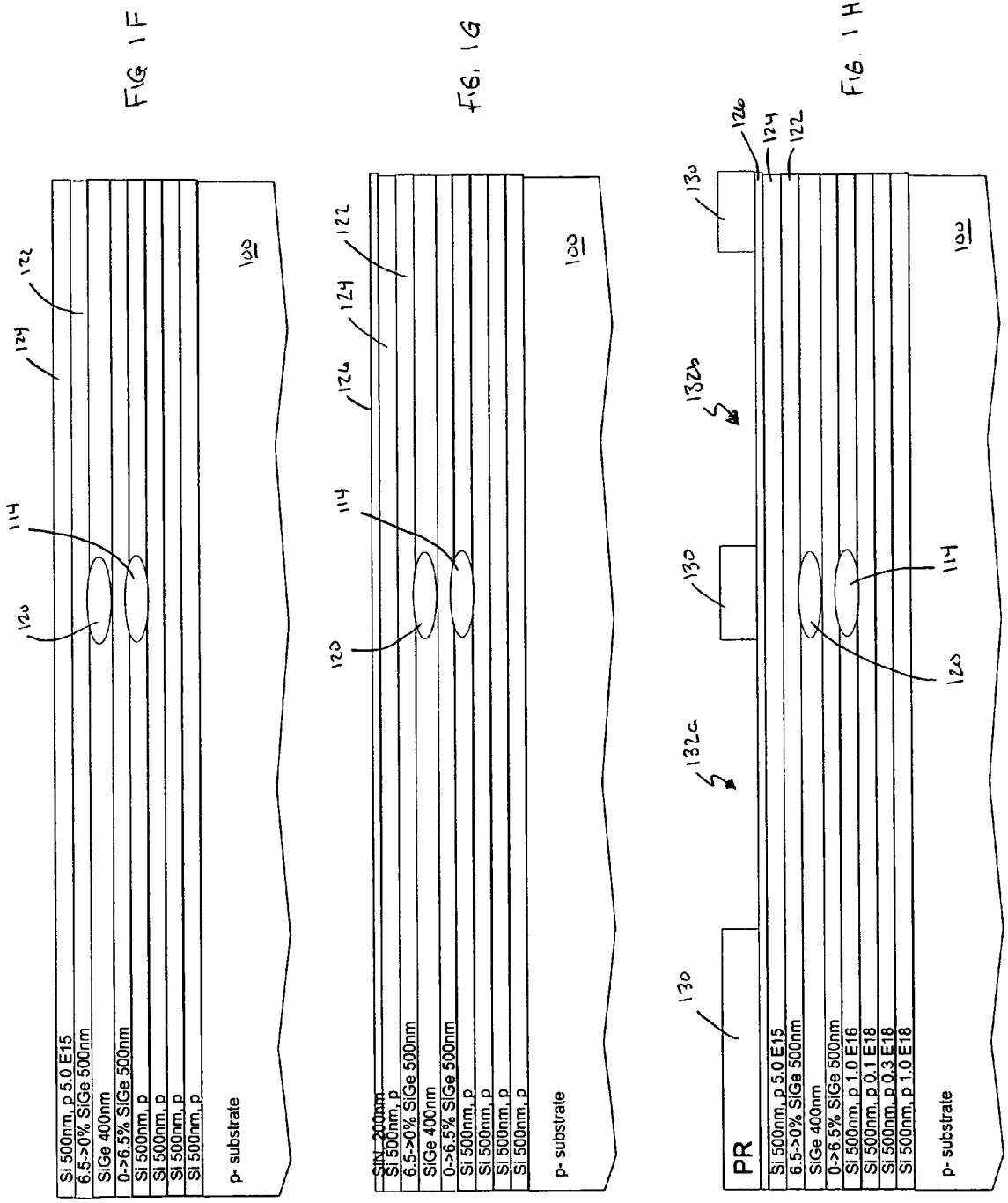

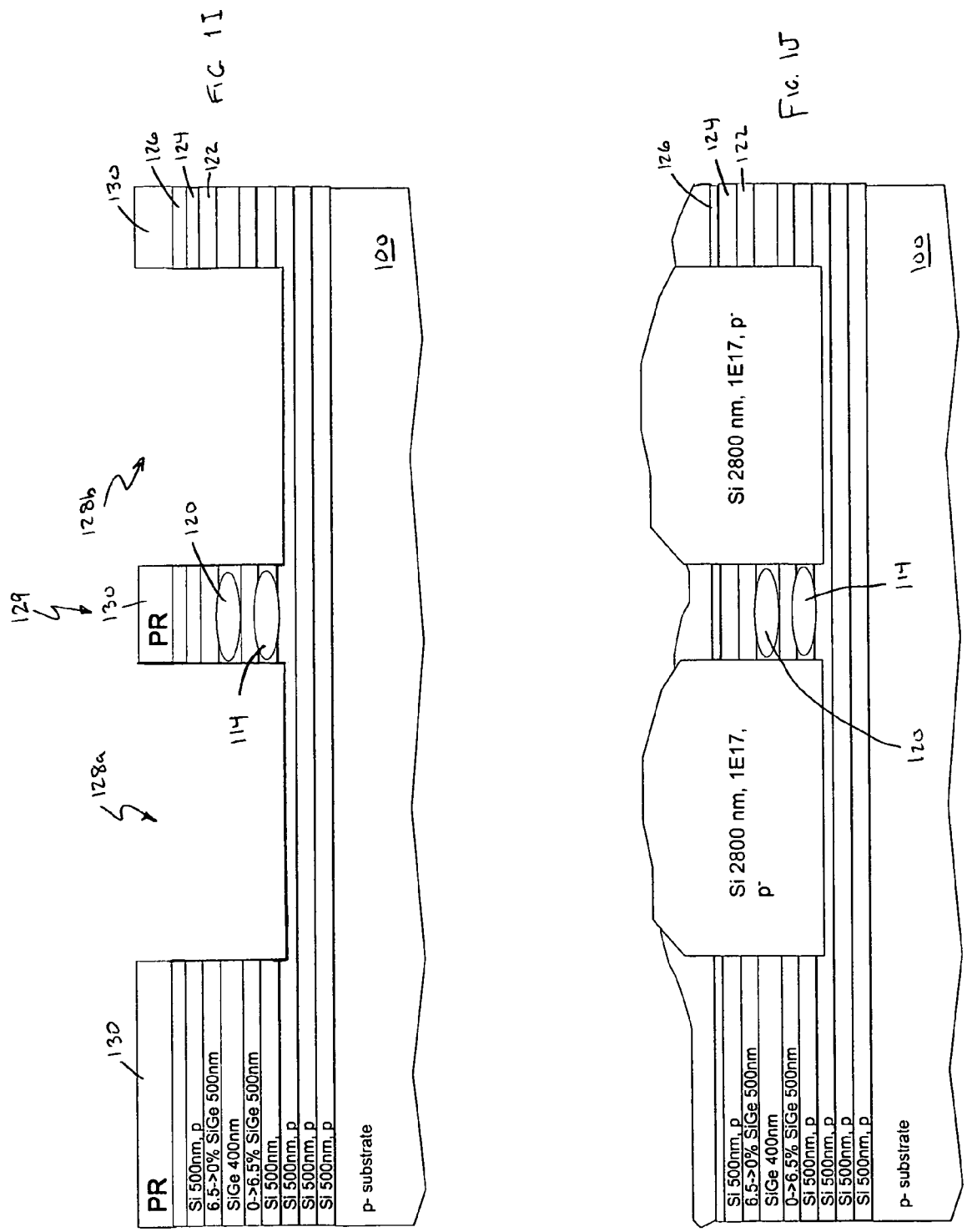

RIDGE TECHNIQUE FOR FABRICATING AN OPTICAL DETECTOR AND AN OPTICAL WAVEGUIDE

This application claims the benefit of U.S. Provisional Application No. 60/713,497, filed Sep. 1, 2005, which is incorporated herein by reference.

TECHNICAL FIELD

This invention relates to a process for fabricating optical waveguides and optical detectors.

BACKGROUND OF THE INVENTION

To build an optical signal distribution network within a semiconductor substrate, one needs to make good optical waveguides to distribute the optical signals, and one needs to fabricate elements that convert the optical signals to electrical signals in order to interface with other circuitry. Extracting the optical signals can be accomplished in two ways. Either the optical signal itself is extracted out of the waveguide and delivered to other circuitry that can convert it to the required form. Or the optical signal is converted into electrical form in the waveguide and the electrical signal is delivered to the other circuitry. Extracting the optical signal as an optical signal involves the use of mirrors, gratings or couplers within the waveguides, or other elements that function like these devices. The scientific literature has an increasing number of examples of technologies that can be used to construct such devices. Extracting the optical signal as an electrical signal involves the use of detectors within the waveguide, i.e., circuit elements that convert the optical signal to an electrical form. The scientific literature also has an increasing number of examples of detector designs that can be used to accomplish this.

The challenge in finding the combination of elements that produces an acceptable optical distribution network becomes greater, however, when one limits the space of solutions to particular optical signal distribution network designs and takes into account the practical reality that any such designs should be relatively easy to fabricate and financially economical.

The combination of silicon and SiGe alloys (e.g. $Si_xGe_{1-x}$) has attracted attention as a useful combination of materials from which one might be able to easily and economically fabricate optical signal distribution networks. With SiGe alloys it is possible to fabricate waveguides in the silicon substrates. The index of refraction of a SiGe alloy is slightly higher than that of silicon. For example, a SiGe alloy with 5% Ge (i.e., $Si_{0.95}Ge_{0.05}$) has an index of refraction of about 3.52 while crystalline silicon has an index of refraction that is less than that, e.g. about 3.50. So, if a SiGe alloy core is formed in a silicon substrate, the difference in the indices of refraction is sufficient to enable the SiGe alloy core to contain an optical signal through internal reflections. Moreover, this particular combination of materials lends itself to the use of conventional silicon based semiconductor fabrication technologies to fabricate the optical circuitry, and therefore it does not interfere or prohibit the further building of electrical circuitry using the usual CMOS processing technology.

Of course, for such a system to work as an optical signal distribution network, the optical signal must have a wavelength to which both the Si and the SiGe alloy are transparent. Since the bandgap energy of these materials is approximately 1.1 eV, they appear transparent to optical wavelengths having a wavelength greater than 1150 nm. A further reduction in bandgap energy caused by use of a SiGe alloy rather than pure Silicon, and higher temperature operation as high as 125° C. may further require the wavelength be longer than 1200 nm or even 1250 nm for very low absorption loss (approximately 1 db/cm or less). But, the transparency of these materials to optical signals having those wavelengths brings with it another problem. These materials are generally not suitable for building detectors that can convert the optical signals to electrical form. To be a good detector, the materials must be able to absorb the light in a manner so as to create useful charge that can be detected electrically. That is, the optical signal must be capable of generating electron transitions from the valence band to the conduction band within the detector to produce an electrical output signal. But the wavelengths greater than 1150 nm are too long to produce useful absorption by electron transitions in silicon, or in $Si_{0.95}Ge_{0.05}$ alloys at room temperature. At a wavelength of 1300 nm, the corresponding photon energy is about 0.95 eV, well below the room temperature band gap of silicon and $Si_{0.95}Ge_{0.05}$ and consequently well below the amount necessary to cause transitions from the valence band into the conductor band.

One detector that meets at least some of the criteria mentioned above is the impurity-based embedded waveguide detector described in U.S. Ser. No. 10/856,127, filed May 28, 2004, entitled "Impurity-Based Waveguide Detector System," incorporated herein by reference. The impurity-based detector described in that reference is fabricated in a trench that is formed in the substrate.

The embodiments described herein present alternative methods for making such a detector.

SUMMARY OF THE INVENTION

In general, in one aspect, the invention features method of fabricating an optical detector in an optical waveguide. The method involves: forming at least one layer on a surface of the substrate, said at least one layer comprising SiGe; implanting an impurity into the at least one layer over a first area to form a detector region for the optical detector; etching into the at least one layer in a first region and a second region to form a ridge between the first and second regions, said ridge defining the optical detector and the optical waveguide; filling the first and second regions with a dielectric material having a lower refractive index than SiGe; and after filling the first and second regions with the dielectric material, removing surface material to form a planarized upper surface.

Other embodiments include one or more of the following features. The first and second regions are first and second trenches, respectively. The dielectric material is Si. The method also involves depositing a SiN layer above the at least one layer, and wherein etching into the at least one layer in the first and second regions to form the ridge involves etching through the SiN layer. Removing surface material to form a planarized upper surface involves removing surface material down to the SiN layer. The method further involves growing a top layer of crystalline silicon on the planarized upper surface, the top layer of crystalline silicon providing a material of sufficiently good quality to fabricate semiconductor microelectronic circuitry within it. Forming the at least one layer involves: depositing a graded layer of $Si_xGe_{1-x}$ above the substrate; and depositing a uniform layer of $Si_yGe_{1-y}$ on the graded layer of $Si_xGe_{1-x}$. Alternatively, forming the at least one layer involves: depositing multiple layers of silicon on the substrate each having a different doping level; and after depositing the multiple layers of silicon, depositing said at least one layer comprising SiGe. Forming the at least one layer further involves: on the multiple layers of silicon, depositing a graded layer of $Si_xGe_{1-x}$; and on the graded layer of $Si_xGe_{1-x}$, depositing a uniform layer of $Si_yGe_{1-y}$, said uniform layer being said at least one layer of SiGe. The multiple layers of silicon include a lowermost layer and wherein each layer after the lowermost layer is characterized by a lower doping level than a preceding layer. Within the graded SixGe1-x layer, the value of x decreases in an upward direction within the layer.

Still other embodiments, include one or more of the following features. The method further involves: forming a first electrically conductive path extending down through the top layer of crystalline silicon and making electrical connection with the silicon in the trenches; and forming a second electrically conductive path extending down through the top layer of crystalline silicon and making electrical connection with an upper portion of the ridge. Forming the first electrically conductive path involves implanting p-type dopant in the top layer of crystalline silicon. Forming the second electrically conductive path involves implanting n-type dopant in the top layer of crystalline silicon. Forming the first electrically conductive path involves: forming a via through the top layer of crystalline silicon; and filling the via with electrically conductive material. The electrically conductive material is doped polysilicon or tungsten. Growing the layer of crystalline silicon on top of the planarized substrate involves epitaxially growing the layer of crystalline silicon. Removing surface material to form the planarized upper surface involves chemical mechanical polishing. The implanted impurity is selected from the group consisting of thallium and indium. Filing the first and second regions involves filling the first and second regions with doped silicon. The method further involves prior to forming at least one layer on a surface of the substrate, etching a wide trench in the substrate, and wherein the first and second regions are located within the wide trench.

In general, in another aspect, the invention features an optical structure including: a substrate; a ridge on the substrate, the ridge made up of at least one layer comprising SiGe, the at least one layer forming a light carrying core region of an optical waveguide, wherein the ridge includes impurities implanted in a region of the at least one layer comprising SiGe to form an optical detector region along the ridge; and dielectric-filled regions on either side of the ridge and defining opposing sidewalls of the ridge, the dielectric-filled regions forming conduction paths for electrically connecting to the optical detector, wherein the dielectric has a lower index of refraction than SiGe.

Other embodiments include one or more of the following features. The dielectric includes silicon. The dielectric-filled regions are dielectric-filled trenches. The optical structure further includes a crystalline silicon layer above the ridge and the dielectric-filled trenches and covering the substrate, the crystalline silicon layer including a first electrically conductive path extending down through the crystalline silicon layer and making electrical connection with the silicon in the trenches and a second electrically conductive path extending down through the crystalline silicon layer and making electrical connection with an upper portion of the ridge.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIGS. 1A-1L illustrate the procedure for fabricating the integrated ridge waveguide and detector.

DETAILED DESCRIPTION

Figure 1D:
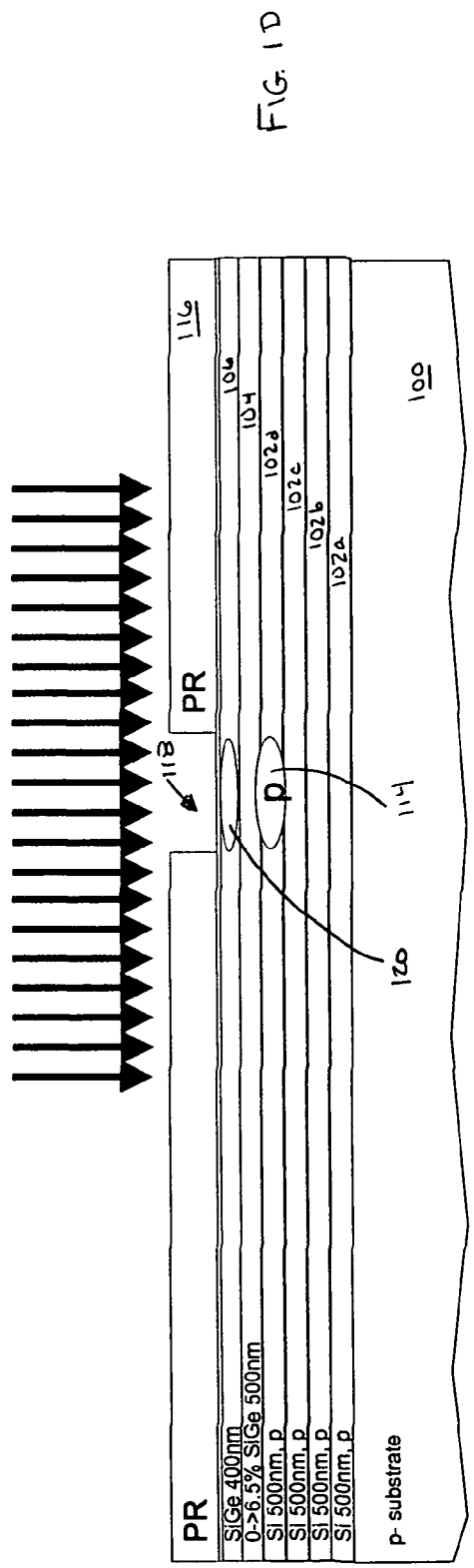

The embodiments described herein involve a double trench method for fabricating waveguides with embedded optical detectors. According to this fabrication method, the materials from which the optical detectors and waveguides are formed are first fabricated on the substrate and then double trenches are etched into this material to define the regions (or ridges) that are to form the optical detectors and the waveguides. This fabrication method is in contrast to an alternative fabrication method according to which a single trench is first formed in a substrate and then the optical detectors and waveguide are fabricated within that single trench.

In the embodiments described below, the process starts with high quality material grown on crystalline silicon. More specifically, multiple epitaxial layers, including SiGe layers from which the waveguide and the detector will be fabricated, are first deposited on a silicon substrate. Then, impurities are implanted at multiple levels in the region that will form an optical detector of the type described in U.S. Ser. No. 10/856,127, filed May 28, 2004, entitled "Impurity-Based Waveguide Detector System," incorporated herein by reference. After the impurities are implanted in the detector region, two trenches are etched into the substrate to define a ridge structure which defines the waveguide with the optical detector embedded therein. The trenches are subsequently filled with doped poly-silicon to make electrical connections to the sides of the optical detector. After planarizing the resulting structure, a high quality silicon layer is formed on top of the wafer to provide the material into which microelectronic circuitry will be subsequently fabricated by using conventional semiconductor fabrication techniques, as described in U.S. Ser. No. 10/623,666, filed Jul. 21, 2003, entitled "Optical Ready Substrates," also incorporated herein by reference.

A more detailed description of the process will now be described with reference to FIGS. 1A-1L.

Referring to FIG. 1A, the starting material is a crystalline p-type silicon substrate 100. After the surface of the substrate is appropriately cleaned and prepared using techniques well known to persons skilled in the art, a sequence of p-type epitaxial layers 102a-d of different doping is grown on top of the substrate, with the first layer 102a having the highest level of doping. On top of this structure, a graded SiGe layer 104 is grown in which the percentage of Ge increases from 1.5% Ge to 6.5% Ge. Then, a uniform SiGe layer 106 (e.g. with Ge at about 6.5%) is grown on the graded SiGe layer. This layer will function as the waveguide core and the detector region of the optical detector.

The sequence of p-type silicon layers 102a-d forms a graded structure in which p-type doping level is reduced in each successive layer that is grown. In other words, the doping level of the silicon decreases as the distance from the waveguide region decreases; or conversely, the doping level of the silicon increases as the distance from the waveguide region increases. This is done to reduce the losses in the waveguide that is fabricated on the silicon. Optical signals will experience greater loss in regions of high doping as compared to regions of low doping. Thus, the design is such as to keep the high doping levels that are needed for electrical contact further away from the optical mode that propagates through the waveguide.

In the case of the graded SiGe layer, the grading serves to reduce the lattice mismatch that would result if the SiGe (6.5% Ge) was grown directly on the silicon material. Reducing the mismatch reduces defects in the waveguide layer and results in a higher quality SiGe core.

In the described embodiment, the actual structure that is grown on the p-type silicon substrate is as follows:

- 500 nm p-type Si epi, doping level: $1.0 \times 10^{18}$ cm$^{-3}$
- 500 nm p-type Si epi, doping level: $0.3 \times 10^{18}$ cm$^{-3}$
- 500 nm p-type Si epi, doping level: $0.1 \times 10^{18}$ cm$^{-3}$
- 500 nm p-type Si epi, doping level: $\sim 1.0 \times 10^{16}$ cm$^{-3}$
- 500 nm undoped SiGe, graded 1.5-6.5%, doping level: $\sim 1.0 \times 10^{15}$ cm$^{-3}$
- 400 nm undoped SiGe, doping level: $\sim 1.0 \times 10^{15}$ cm$^{-3}$ After the waveguide material has been grown on the substrate, the lower electrode region and the absorber region of the optical detector are formed. This is done by first depositing a thin oxide layer 108 (e.g. 100 Å) on top of the SiGe and then covering that with photoresist 110 (FIG. 1B). The thin oxide layer serves to prevent germanium enrichment during subsequent processing. The photoresist when patterned serves to define windows 112 (see FIG. 1C) through which the implanting is to take place and are located where the optical detectors are to be fabricated. Typically, the length L of detector opening will be between 10-20μ long, though other lengths might be appropriate depending on the requirements of the detector and the circuit (see FIG. 2). It must be long enough to absorb a sufficient amount of the optical signal to generate the required detector signal.

Referring to FIG. 1C, after the photoresist has been lithographically patterned, a first deep boron implant 114 is performed through the openings 112 in the photoresist and the process parameters are selected to target particular level in structure that is being fabricated. In other words, the implant energy is selected to cause the boron to be deposited at the depth at which the electrode is required, e.g. just below the SiGe waveguide core and the concentration is selected to produce the desired electrical characteristics of the contact region (e.g. a region with sufficiently low resistivity). In the described embodiment, the implant energy is about 100 to 160 keV and the concentration of boron is about $1.0 \times 10^{13}$ cm$^{-2}$.

Figure 2:
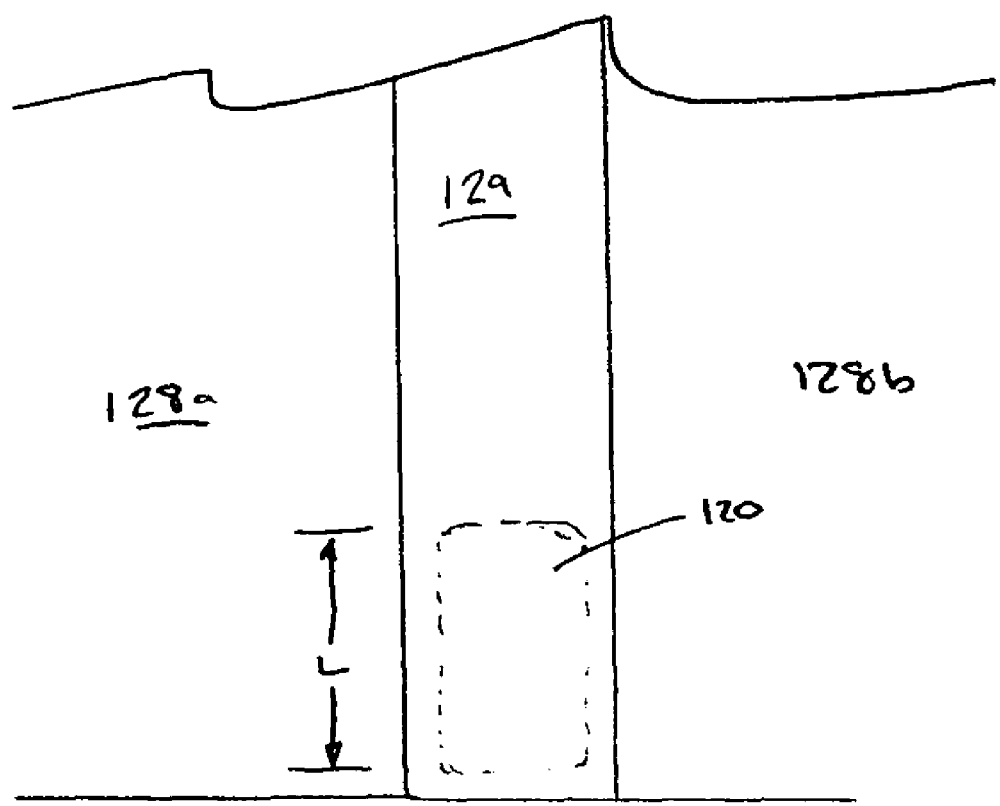
FIG. 2 shows a top view of the substrate with the impurity implant.

After the lower electrode implant is performed, the layer of photoresist is removed by using conventional techniques (e.g. an ashing step followed by a wet clean). Referring to FIG. 1D, the wafer is then covered with a new layer of photoresist 116 which will serve to define the mask for implanting the absorber impurities in the optical detector. Windows 118 are lithographically formed in the photoresist above the locations at which the absorbers regions are to be formed. Then, the impurity dopant 120 (e.g. indium or thallium) is implanted into the wafer through the windows. The implant energy is selected so that the impurity penetrates to about the middle of the SiGe core layer and the concentration is made sufficiently high to produce optical detectors with the desired efficiency. In the described embodiment, the implant energy is at about 180 keV and the concentration is about $1.0 \times 10^{14}$ cm$^{-2}$. In general, one can tailor the dose and energies so that a large volume of activated species is present in the waveguide core. This may utilize different implant doses, energies and co-implants of other species. Alternatively, one can leave the mask from the previous step in place and simply implant through that mask into the desired regions.

Figure 1E:
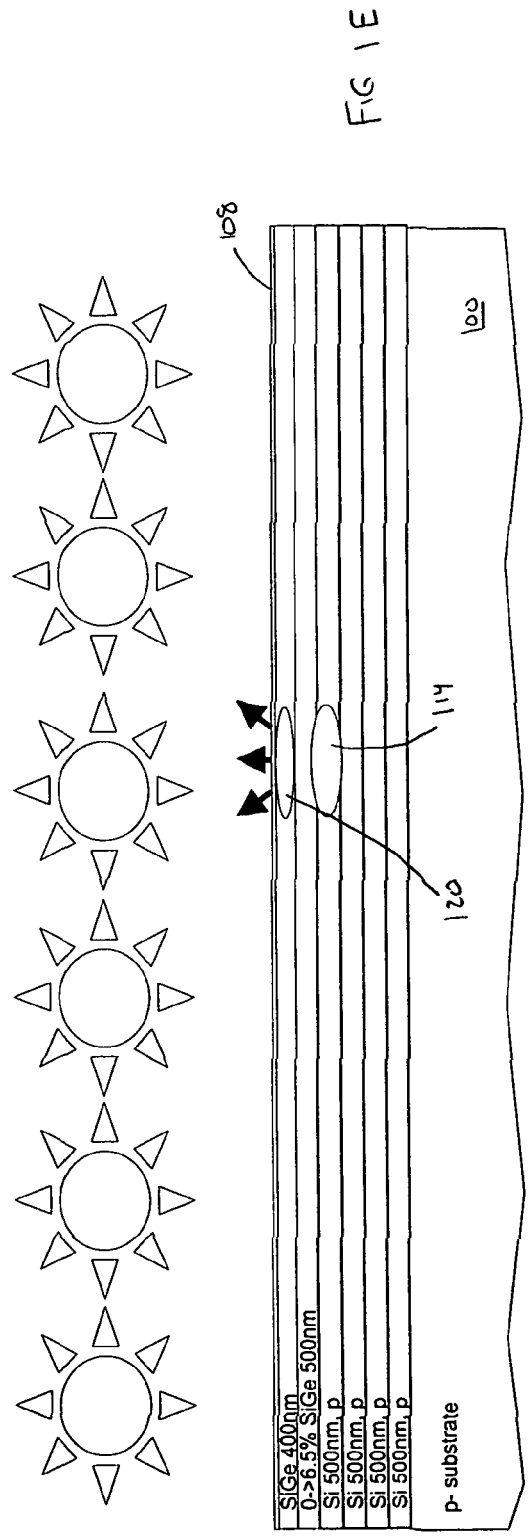
Figure 1K:
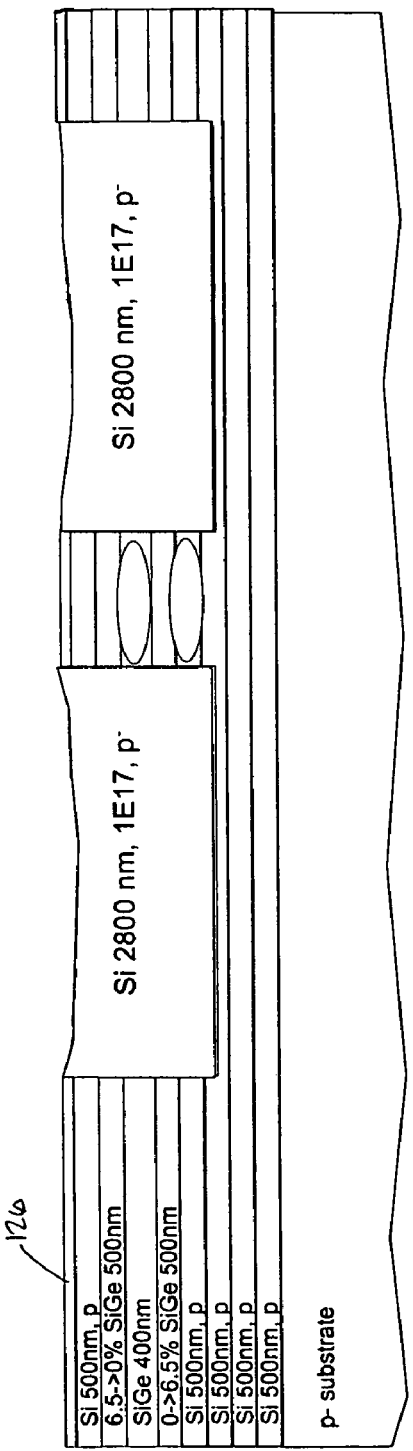

Referring to FIG. 1E, after the absorber impurity has been implanted, the photoresist is removed and the wafer is cleaned. Then, a pre-anneal is performed to heal the crystal that was damaged as a result of the implantation. During this phase, care is taken to prevent out-diffusion of the absorber dopant. In the described embodiment, the pre-anneal protocol involves heating the wafer to 600° C. for about 1 hour, followed by heating it to about 750° C. for 30 minutes.

Referring top FIGS. 1F and 1G, after the pre-anneal is completed, the thin oxide layer 108 is stripped away (e.g. by dipping the wafer in HF) and the surface of the wafer is cleaned by using an H$_2$ reactive pre-clean to prepare the surface for an epitaxial regrowth of material on the SiGe core layer. This epitaxial regrowth will form the layers which serve as the upper electrode of the optical detector and a upper cap layer for the waveguide. In the described embodiment, the epitaxial regrowth process deposits a first layer 122 including 200 nm of undoped SiGe (6.5%) followed by 500 nm of undoped SiGe, graded from 6.5% Ge to 0% Ge, and ending with the growth of over 500 nm of undoped Si 124 ($\sim 5.0 \times 10^{15}$ cm$^{-3}$ p-type).

The thickness of the upper undoped silicon layer 124 depends on what metal will later be used to connect to the device. If it is aluminum the thickness can be about 500 nm. However, if it is tungsten, the thickness will need to be greater, e.g. 800 nm. If using silicide to reduce the contact resistance, it is preferred to manufacture the contact off to the side of the waveguide.

Referring to FIG. 1G, after the upper silicon layer has been epitaxially grown on the wafer, a SiN layer 126 is then deposited on the new silicon layer. This SiN layer 126 will later serve as a stop layer for a subsequent CMP (Chemical Mechanical Polish) that is performed to planarize the wafer. The SiN layer needs to be sufficiently thick to serve that function. In the described embodiment, it is about 1000 Å. SiN deposition is preferred to reduce the thermal budget of the manufacturing process when compared to a thermally grown SiN film.

With the lower electrode and absorber impurity implants in place, the wafer is ready for patterning the mesas or ridges that will define the optical waveguides and the embedded detectors. In essence, the epitaxially grown material is removed except in areas that will serve as the optical waveguides with the embedded detectors. In FIGS. 1H-1I, this process is illustrated through the formation of two trenches 128 and 128b, one on each side of the region that is to form the mesa or ridge. The material remaining between the two trenches is the mesa or ridge 129.

To form the trenches 128a and 128b, photoresist 130 is again put on the surface and it is lithographically patterned to form openings 132a and 132b that define the trench regions. The openings expose the underlying SiN layer 126. The exposed SiN layer and the underlying SiGe and Si layers are etched away (e.g. by using SF$_6$, C$_4$F$_8$ chemistry) to a depth just below the level of the lower electrode to form the trenches 128a and 128b. In the described embodiment the depth is about 2.8 μm. To withstand an etch to the desired depth, the photoresist protecting the other portions of the surface needs to be sufficiently thick. Thus, the deeper the etch is, the thicker the photoresist will need to be. However, thicker photoresist also degrades line edge roughness which determines the smoothness of the sidewalls of the optical waveguide. Rougher sidewalls lead to greater losses in the transmitted optical signal. All of these considerations need to be taken into account when designing the structure.

After the trenches 128a and 128b have been formed, the photoresist 130 is removed to expose the SiN protective layer 126 on top of the wafer.

Referring to FIG. 1J, with the SiN layer now exposed, a selective epitaxial growth of doped silicon is performed to fill the trenches. In general, there are two ways of filling in the trenches: non-selective deposition of Si over the entire wafer or selective deposition of silicon within the trenches. The use of the SiN layer facilitates the selective deposition of silicon within the trenches with much less silicon grown on the SiN layer. This is because silicon tends not to grow in a crystalline form on the SiN, which is an amorphous dielectric material. The amount of polycrystalline deposition that takes place on the SiN can be minimized by appropriately selecting the process parameters used to perform the epitaxial growth. The details of how to do this are well known to persons of ordinary skill in the art.

The doping concentration that is chosen for the silicon deposited in trenches needs to be compatible with the characteristics that are desired for the waveguide. If the doping level is too high, the trench material will bleed off energy from the optical modes that inevitably extend into the trench material. In the described embodiment, the silicon that is grown is 3 μm thick and has a doping of $1\times10^{17}$ p-type. The amount that is grown needs to be sufficient to fill the trenches and the doping level that is chosen is based on the desired characteristics of the waveguide that is being fabricated.

Using epitaxially grown silicon in the trenches results in a small Δn between the optical waveguide and the trench material. The small Δn tends to permit the optical signal to extend out into the slightly doped and therefore more lossy silicon cladding region but it also reduces the more serious impact of any line edge roughness that might result from the etch process.

For subsequent processes during which a high quality crystalline silicon will be formed above the optical network that has been fabricated, the top of the wafer needs to be flat. So, after the trenches are filled, the surface of the wafer is planarized by using CMP to remove the silicon down to the SiN layer (see FIG. 1K). During this planarization process, the SiN layer 126 functions as an effective stop layer which effectively prevents the CMP from proceeding into the underlying material. Once the SiN layer is exposed, it is then removed by using e.g. a reactive ion etch (RIE) or wetclean. The CMP process will tend to dish-out the areas that were not protected by the SiN layer. To flatten the surface sufficiently to grow another epitaxial layer over the entire wafer, after the SiN removal the wafer is further polished to reduce or remove the dishing and improve the surface roughness.

Of course, instead of using CMP one could use other techniques to remove the excess material above the SiN layer. For example, one could alternatively use RIE (reactive ion etch).

Figure 1L:
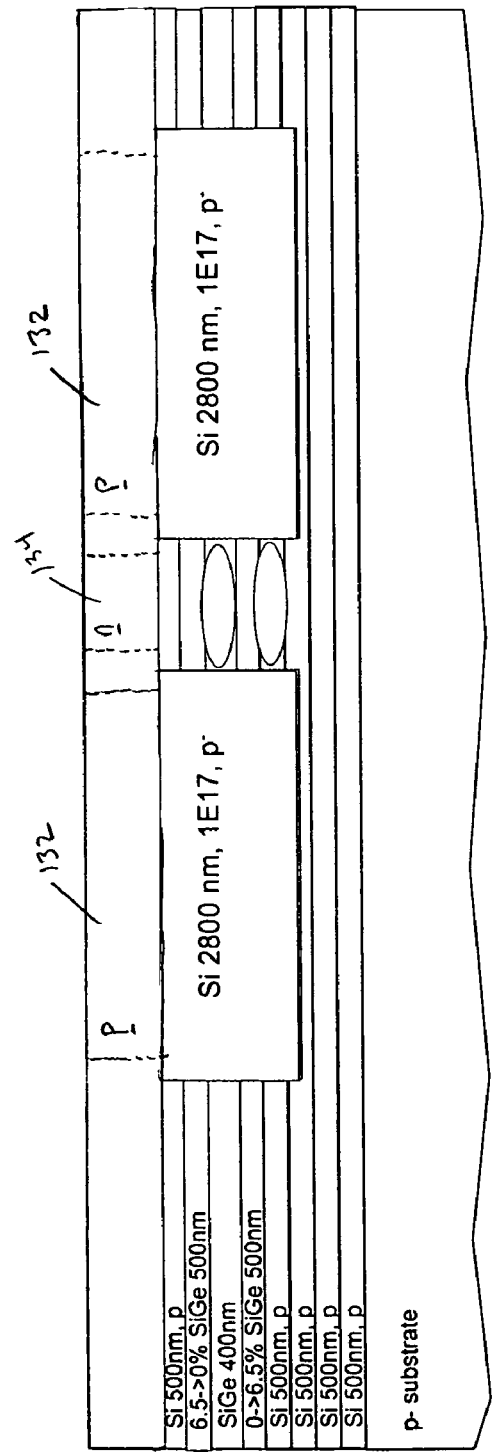

After the surface has been adequately prepared, a silicon epitaxial layer is then grown on top of the entire wafer (see FIG. 1L). This layer represents the layer into which the microelectronic devices and circuitry can be later fabricated using conventional semiconductor processing techniques, e.g. CMOS. In the described embodiment, this layer is about 1.7 μm though it could be thinner or thicker depending upon the requirements of the subsequent process that is used to fabricate the microelectronic circuitry in the layer.

In the described embodiment, electrical contact is made to the underlying silicon-filled trench regions by using ion implantation to form highly doped p-type wells 132 within the epi layer. To adequately dope the silicon down to the silicon-filled trenches typically requires performing multiple implantations each at a different energy level. For example, there is a high energy implant to drive the dopant down to just above the top of the silicon-filled trench, a moderate energy implant to penetrate to the middle of the epitaxial layer, and a lower energy implant to deposit dopant near the top of the epitaxial layer. An anneal is then used to diffuse the dopant out in the well region to make the doping of the well region more uniform.

A similar procedure is used to form highly doped n-type wells 134 extending down to the upper electrode of the impurity detector.

An alternative technique for making electrical contact to the trench regions is to etch vias that extend down through the epitaxial layer to the trench region and the upper electrode. These via are then filled with either a highly doped polysilicon material or a tungsten plug, both of which will provide a good electrical connection to the trench material.

Earlier in the process when the graded silicon layers are deposited (see FIG. 1A), rather than using a highly doped first layer, one can use a low-doped first layer. Then, in the regions under where the detectors will be located, this material can be selectively doped to higher levels, e.g. using implant. This would have the advantage of requiring fewer spacer layers which are used to keep the highly doped first layer away from the waveguide.

The details presented above for the described embodiments are meant to merely be illustrative. The selections of grading structure, depths, doping levels, etc. all represent tradeoffs in performance and design. In part, the selections might also be constrained by the equipment that is available and by circuit design considerations. It might also be desirable to use conventional fabrication processes that are fine tuned for the fabrication of the optical elements; that would result in a protocol that fits within existing fabrication protocols that have been developed for the microelectronic circuitry that is made at the facility.

Figure 3:
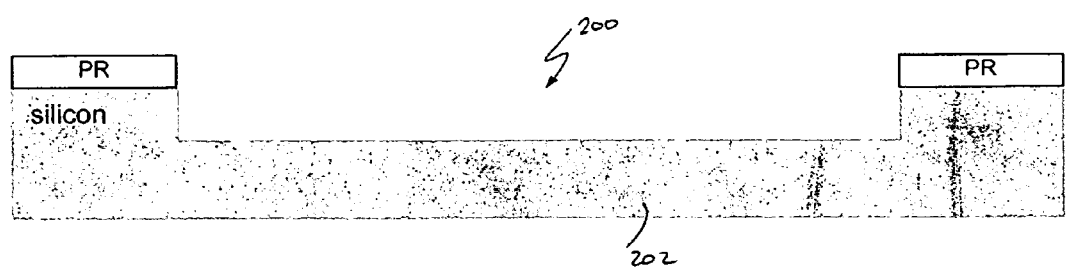
FIGS. 3A-E illustrate a procedure for fabricating an alternative embodiment of the integrated ridge waveguide and detector.
Figure 3:
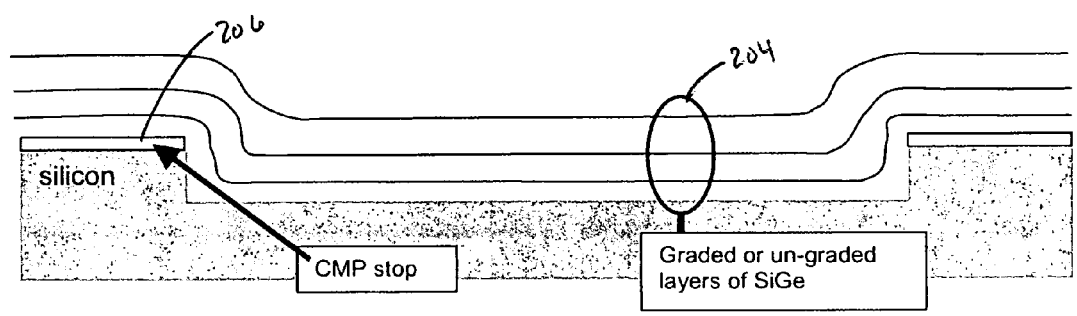
Figure 3C:
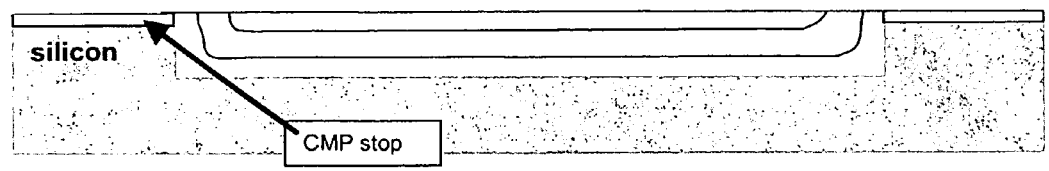
Figure 3D:
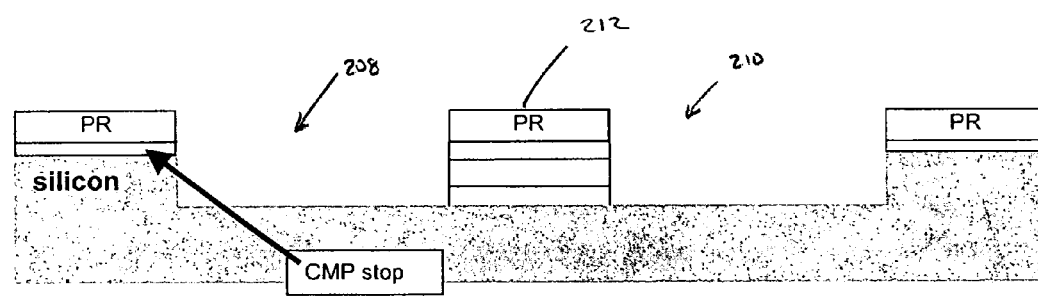
Figure 3E:

An alternative method for fabricating an integrated ridge waveguide and detector is illustrated in FIGS. 3A-F. The fundamental difference is the ridge is fanned in a wide trench that had been filled with SiGe. Referring to FIG. 3A, a wide trench 200 is etched into a silicon substrate 202. Then, a SiN layer 206 is fanned on the surface of substrate 202 that is outside of the trench and after that multiple layers of SiGe 204 (either graded or ungraded layers) are deposited on the surface of substrate 202 and within wide trench 200 (see FIG. 3B). The resulting structure is then chemically mechanically polished down to SiN layer 204 to planarize the surface (see FIG. 3C). Trenches 208 and 210 are then etched into the material filling wide trench 200 to define a ridge 212 (see FIG. 3D). Finally, trenches 208 and 210 are filled with a dielectric material (e.g. Si) and the structure is planarized (see FIG. 3E), much the same way as was previously described (see FIG. 3E).

In addition, instead of using epitaxial growth to fill the trenches one could use other CVD processes.

In the embodiment described above, the ridge is formed by etching the material away to form two trenches which define the ridge. Those trenches can be narrow trenches, as described above, or they can be very wide trenches. Indeed, one approach is to etch away everything except the ridge thereby causing the trenches to extend to the edges of the chip or wafer (also referred to as the Arkadii method).

Also in the embodiments described above, the trench was filled with silicon. But it can be filled with any appropriate material that has lower refractive index, e.g. Si (doped or undoped) or dielectrics like SiN or SiOx, diamond-like carbon, spin-on-glass (SOG), where those filling materials are preferably CMOS compatible. Also, note that a SiN top layer (i.e., deposited before filling the trenches) can be used as a CMP stop layer. However, it may not be needed if the filling material is something other than silicon.

The field area (i.e., the area without any waveguide or trench) can be used to manufacture microelectronic circuitry (after planarization that follows the trench fill). If that microelectronic circuitry is fabricated away from the trenches and waveguides, one can probably use the original silicon that was protected by the SiN during the planarization process. This high quality silicon could also be grown on the whole wafer including the trench and waveguide area, i.e., covering them or it could also be applied using a layer transfer method. For lower quality electrical devices (e.g. having slower speed and/or more leakage current) an additional top layer or keep-out areas for avoiding the waveguide and trenches may not be required.

With respect to electrical connections, it might be desirable to dope the silicon and parts of the SiGe that forms the waveguide. Implant is a particularly good method to dope the bottom and top and active areas of the detector, to form conductive parts in the trench fill material, etc. In-situ doping of material during its deposition is also possible, but has to be done in such way as to keep the losses in the optical waveguide low. Connections using metal and/or silicide or very highly doped regions should be kept off to the side of the waveguide, as their absorption coefficients are typically too large for them to be located on top of the waveguide ridge, unless a thick top layer is used. In general, details of the geometry of the connections depend on the trade-off between resistance, capacity (i.e., detector speed), and non-productive optical losses incurred within the detector.

It should be noted that planarity is important for the subsequent manufacture of devices (to avoid lithography problems, resist problems, etc.). In addition, one might be able to manufacture some microelectronic circuitry before the manufacture of the waveguide.

Other embodiments are within the following claims.

What is claimed is:

1. A method of fabricating on a substrate an optical detector in an optical waveguide, said method comprising:
    forming at least one layer on a surface of the substrate, said at least one layer comprising SiGe;
    implanting a first impurity in a first area through the at least one layer into a region below the at least one layer to form a contact region for the optical detector;
    implanting a second impurity in the first area and into the at least one layer over a first area to form a detector region for the optical detector, wherein the second impurity is different from the first impurity;
    after implanting the second impurity, etching into the at least one layer in a first region and a second region to form a ridge between the first and second regions, said ridge defining the optical detector and the optical waveguide;
    filling the first and second regions with a dielectric material having a lower refractive index than SiGe; and
    after filling the first and second regions with the dielectric material, removing surface material to form a planarized upper surface.

2. The method of claim 1, wherein the first and second regions are first and second trenches, respectively.

3. The method of claim 1, wherein the dielectric material comprises Si.

4. A method of fabricating on a substrate an optical detector in an optical waveguide, said method comprising:
    forming at least one layer on a surface of the substrate, said at least one layer comprising SiGe;
    implanting an impurity into the at least one layer over a first area to form a detector region for the optical detector;
    depositing a SiN layer above the at least one layer;
    etching through the SiN layer and into the at least one layer in a first region and a second region to form a ridge between the first and second regions, said ridge defining the optical detector and the optical waveguide;
    filling the first and second regions with a dielectric material having a lower refractive index than SiGe; and
    after filling the first and second regions with the dielectric material, removing surface material to form a planarized upper surface.

5. The method of claim 4, wherein removing surface material to form a planarized upper surface involves removing surface material down to the SiN layer.

6. A method of fabricating on a substrate an optical detector in an optical waveguide, said method comprising:
    forming at least one layer on a surface of the substrate, said at least one layer comprising SiGe;
    implanting an impurity into the at least one layer over a first area to form a detector region for the optical detector;
    etching into the at least one layer in a first region and a second region to form a ridge between the first and second regions, said ridge defining the optical detector and the optical waveguide;
    filling the first and second regions with a dielectric material having a lower refractive index than SiGe;
    after filling the first and second regions with the dielectric material, removing surface material to form a planarized upper surface; and
    growing a top layer of crystalline silicon on the planarized upper surface, said top layer of crystalline silicon providing a material of sufficiently good quality to fabricate semiconductor microelectronic circuitry within it,
    wherein forming said at least one layer comprises:
    depositing multiple layers of silicon on the substrate each having a different doping level; and
    after depositing the multiple layers of silicon, depositing said at least one layer comprising SiGe.

7. The method of claim 6, wherein forming said at least one layer comprises:
    depositing a graded layer of $Si_xGe_{1-x}$ above the substrate; and
    depositing a uniform layer of $Si_yGe_{1-y}$ on the graded layer of $Si_xGe_{1-x}$.

8. The method of claim 6, wherein forming said at least one layer further comprises:
    on the multiple layers of silicon, depositing a graded layer of $Si_xGe_{1-x}$; and
    on the graded layer of $Si_xGe_{1-x}$, depositing a uniform layer comprising $Si_yGe_{1-y}$, said uniform layer being said at least one layer of SiGe.

9. The method of claim 6, wherein the multiple layers of silicon include a lowermost layer and wherein each layer after the lowermost layer is characterized by a lower doping level than a preceding layer.

10. The method of claim 8, wherein within the graded $Si_xGe_{1-x}$ layer, the value of x decreases in an upward direction within the layer.

11. A method of fabricating on a substrate an optical detector in an optical waveguide, said method comprising:
    forming at least one layer on a surface of the substrate, said at least one layer comprising SiGe;
    implanting an impurity into the at least one layer over a first area to form a detector region for the optical detector;

etching into the at least one layer in a first region and a second region to form a ridge between the first and second regions, said ridge defining the optical detector and the optical waveguide;

filling the first and second regions with a dielectric material having a lower refractive index than SiGe;

after filling the first and second regions with the dielectric material, removing surface material to form a planarized upper surface;

growing a top layer of crystalline silicon on the planarized upper surface, said top layer of crystalline silicon providing a material of sufficiently good quality to fabricate semiconductor microelectronic circuitry within it;

forming a first electrically conductive path extending down through the top layer of crystalline silicon and making electrical connection with the dielectric material in the trenches; and forming a second electrically conductive path extending down through the top layer of crystalline silicon and making electrical connection with an upper portion of the ridge, wherein the first and second regions are first and second trenches, respectively.

12. The method of claim 11, wherein forming the first electrically conductive path comprises implanting p-type dopant in the top layer of crystalline silicon.

13. The method of claim 11, wherein forming the second electrically conductive path comprises implanting n-type dopant in the top layer of crystalline silicon.

14. The method of claim 11, wherein forming the first electrically conductive path comprises:

forming a via through the top layer of crystalline silicon; and filling the via with electrically conductive material.

15. The method of claim 14, wherein the electrically conductive material is doped polysilicon.

16. The method of claim 14, wherein the electrically conductive material is tungsten.

17. The method of claim 6, wherein growing said layer of crystalline silicon on top of the planarized substrate comprises epitaxially growing said layer of crystalline silicon.

18. The method of claim 1, wherein removing surface material to form the planarized upper surface comprises chemical mechanical polishing.

19. The method of claim 6, wherein the implanted impurity is selected from the group consisting of thallium and indium.

20. The method of claim 6,
wherein filling the first and second regions involves filling the first and second regions with doped silicon.

21. A method of fabricating on a substrate an optical detector in an optical waveguide, said method comprising:

etching a wide trench in the substrate;

after etching the wide trench, forming at least one layer on a surface of the substrate, said at least one layer comprising SiGe;

implanting an impurity into the at least one layer over a first area to form a detector region for the optical detector;

etching into the at least one layer in a first region and a second region to four a ridge between the first and second regions, said ridge defining the optical detector and the optical waveguide and wherein the first and second regions are located within the wide trench;

filling the first and second regions with a dielectric material having a lower refractive index than SiGe; and after filling the first and second regions with the dielectric material, removing surface material to form a planarized upper surface.

* * * * *